United States Patent
Hooi et al.

(10) Patent No.: US 8,327,305 B1
(45) Date of Patent: Dec. 4, 2012

(54) VOLTAGE DROP AWARE CIRCUIT PLACEMENT

(75) Inventors: Woi Jie Hooi, Sitiawan (MY); Teik Wah Lim, Bayan Lepas (MY); Ket Chiew Sia, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 635 days.

(21) Appl. No.: 12/534,053

(22) Filed: Jul. 31, 2009

(51) Int. Cl.
*G06F 17/50* (2006.01)

(52) U.S. Cl. ........ 716/124; 716/121; 716/122; 716/123; 716/128; 716/129; 716/130; 716/131; 716/137

(58) Field of Classification Search .................. 716/121, 716/122, 123, 124, 128, 129, 130, 131, 137
See application file for complete search history.

(56) References Cited

U.S. PATENT DOCUMENTS

| | | | | |
|---|---|---|---|---|
| 6,185,706 B1* | 2/2001 | Sugasawara | ................. | 714/724 |
| 6,411,923 B1* | 6/2002 | Stewart et al. | ................. | 703/25 |
| 6,449,761 B1* | 9/2002 | Greidinger et al. | ........... | 716/122 |
| 6,795,952 B1* | 9/2004 | Stine et al. | ..................... | 716/56 |
| 7,290,239 B1* | 10/2007 | Singh et al. | .................... | 716/104 |
| 7,861,190 B1* | 12/2010 | Kretchmer et al. | ........... | 716/102 |
| 7,954,079 B2* | 5/2011 | Kim et al. | ...................... | 716/132 |
| 8,099,692 B1* | 1/2012 | Kretchmer et al. | ........... | 716/100 |
| 2006/0206848 A1* | 9/2006 | Teig et al. | ........................ | 716/10 |
| 2007/0245281 A1* | 10/2007 | Riepe et al. | ....................... | 716/9 |
| 2007/0250796 A1* | 10/2007 | Douriet et al. | ..................... | 716/2 |
| 2008/0005711 A1* | 1/2008 | Scheffer | ............................. | 716/7 |
| 2008/0195984 A1* | 8/2008 | Dougherty, et al. | .............. | 716/2 |
| 2009/0031269 A1* | 1/2009 | Chen et al. | ........................ | 716/9 |
| 2009/0037850 A1* | 2/2009 | Gray et al. | ........................ | 716/2 |
| 2009/0259981 A1* | 10/2009 | Patel | ................................. | 716/9 |

* cited by examiner

*Primary Examiner* — Phallaka Kik
(74) *Attorney, Agent, or Firm* — Womble Carlyle Sandridge & Rice, LLP

(57) ABSTRACT

A circuit and methods for placing a circuit block on an integrated circuit (IC) are disclosed. An embodiment of the disclosed method includes dividing the IC into multiple regions based on pre-determined value. This pre-determined value may be a voltage drop value measured on specific regions on the IC. The performance requirement for the circuit block is determined and placed in one of the regions on the IC. In one embodiment, the placement of the circuit block is based on the performance requirement and the measured value at specific regions on the IC. The measured value may be a voltage drop value and a circuit block with a higher performance may be placed in a region with a lower voltage drop value.

19 Claims, 6 Drawing Sheets

VOLTAGE DROP AWARE CIRCUIT PLACEMENT

BACKGROUND

Voltage drop, in integrated circuits (IC) refers to the resistance (R) encountered by the current (I) flowing through different parts of the IC. According to Ohm's Law, voltage (V) is proportional to current (I) and resistance (R) and is represented by the equation V=I*R. Thus, voltage drop measured across different portions of an IC is also commonly referred to as IR drop.

Generally, ICs with different circuitry and packaging configurations may experience different levels of voltage or IR drops at different parts of the circuitry. In other words, power distribution across an IC varies and may depend on the complexity of the circuitry or the packaging configuration. For instance, wirebond packages have power pads at the edges of the IC package surrounding the IC. There is usually a significant voltage drop as power travels from the edge of the IC package to the center of the IC chip. As such, the core of the IC chip, which is located farthest from the edges of the IC package, will experience the highest level of voltage drop while the periphery of the IC chip close to the edges of the IC package will experience the lowest level of voltage drop.

As voltage drop varies across different regions of the IC, circuit blocks with different speed requirements can be placed in different regions in order to optimize performance in the device. For instance, high speed circuit blocks usually have higher power consumption. Therefore, these blocks need to be placed in a lower voltage drop region. On the other hand, circuit blocks operating at a lower speed will have lower power consumption and need not be placed in a low voltage drop region.

Therefore, it is desirable to have a way to divide an IC into different regions based on measured voltage drop values. It is also desirable to have a way to map or place critical timing circuit blocks in specific regions to optimize the performance of a device. It is within this context that the invention arises.

SUMMARY

Embodiments of the present invention include methods and a circuit for placing circuit blocks on an integrated circuit (IC).

It should be appreciated that the present invention can be implemented in numerous ways, such as a process an apparatus, a system, a device or a method on a computer readable medium. Several inventive embodiments of the present invention are described below.

In one embodiment, a method for placing a circuit block on an IC is disclosed. In one embodiment, the circuit block may be a block of logic elements in an IC design. The method includes dividing the IC into multiple regions based on a measured value. The performance requirement for the circuit block is determined before the circuit block is placed on the IC. The circuit block is placed in one of the regions on the IC based on its performance requirement and the measured value of that region. In one embodiment, the measured value may be a voltage drop value measured across the IC.

In another embodiment, a machine-readable medium encoded with machine-readable instructions for placing a circuit element on an IC is disclosed. The machine-readable medium has program instructions for dividing the IC into multiple regions according to a range of voltage values. The machine-readable medium also has program instructions for determining the timing constraint of the circuit element, mapping the timing constraint to one of the multiple regions on the IC and placing the circuit element onto the mapped region.

In yet another embodiment in accordance with the present invention, an IC in a package is disclosed. The IC package has a plurality of signal pads that are used to connect circuit elements in the IC to the IC package. The IC has a plurality or regions divided based on the measured voltage drop value between the signal pads and the various regions across the IC. Each of the circuit elements is placed in one of the regions on the IC based on the measured voltage drop.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe methods and a circuit for placing circuit blocks on an integrated circuit (IC).

It will be obvious, however, to one skilled in the art, that the present invention may be practiced without some or all of these specific details. In other instances, well-known operations have not been described in detail in order not to unnecessarily obscure the present invention.

The embodiments described herein provide techniques to place circuit blocks in specific regions based on voltage drop values across different parts of a die or IC chip. Circuit blocks with critical timing should be placed in a low voltage drop region while circuit blocks with less critical timing can be placed in a high voltage drop region. Mapping and placing circuit blocks according to timing requirements and measurable voltage drop values can potentially improve the performance of the IC. As an illustrative example, an IC in a wirebond package may have a higher voltage drop at its center region farthest from the signal pads located at the perimeter of the IC package compared to its periphery region closest to the signal pads on the IC package. Therefore, if the IC is divided into different regions based on the measured voltage drop values, then critical timing circuit blocks can be placed in a low voltage drop region to improve the performance of the device. One embodiment in accordance with the present invention divides the IC into several regions based on different voltage drop values measured across the IC and maps circuit blocks with critical timing away from the region with a high voltage drop.

Figure 1:
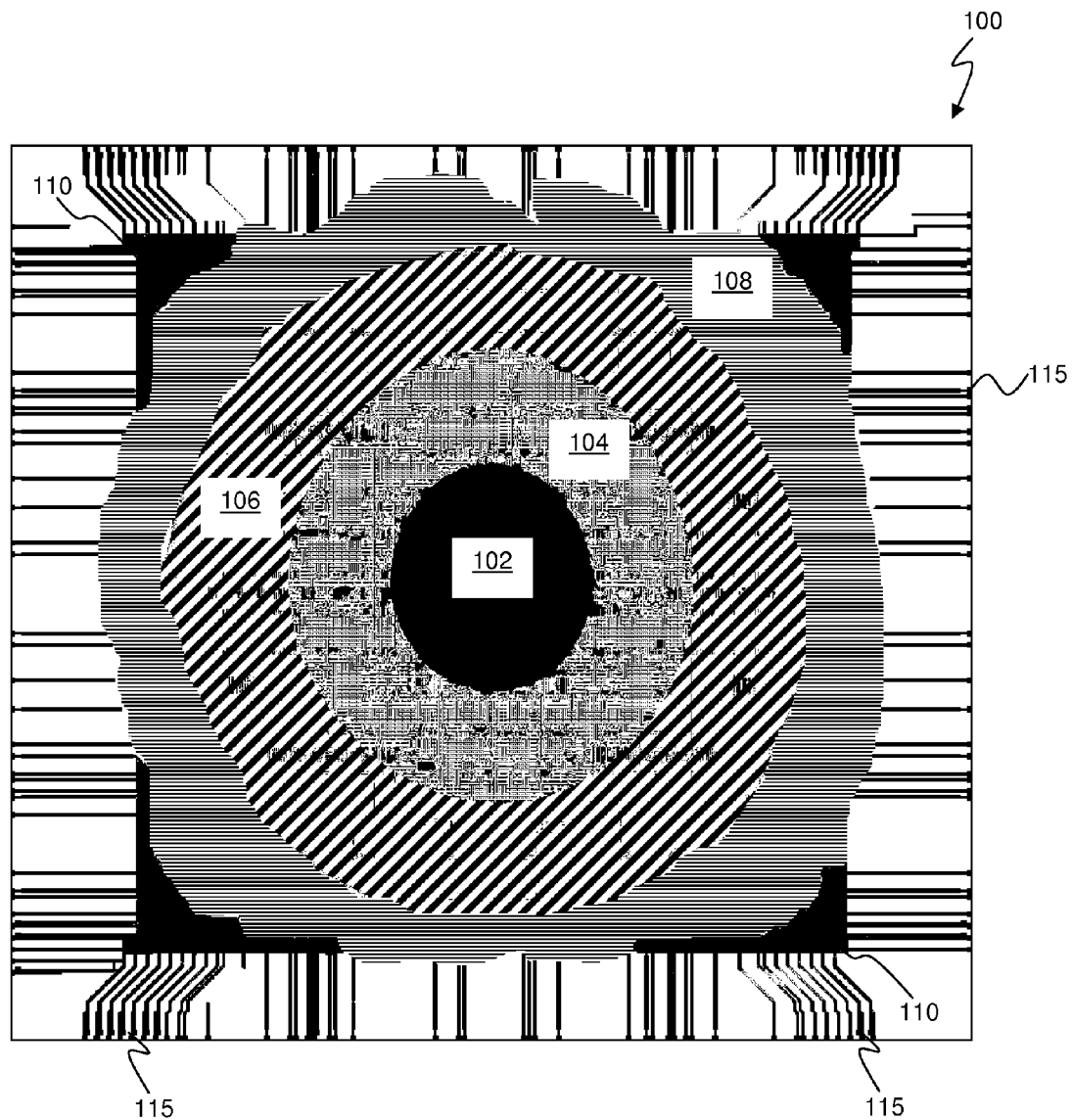
FIG. 1, meant to be illustrative and not limiting, shows an IC divided into several regions on an IC package.

FIG. 1, meant to be illustrative and not limiting, shows IC package 100 with IC 110 divided into several regions. Even though a wirebond IC package 100 is shown in FIG. 1, it should be appreciated that other types of IC packages (e.g., flip chip package) may be applicable in this context. Bondwires 115 connect circuit elements in IC 110 to IC package 100. As an exemplary embodiment, bondwires 115 can be gold, aluminum or copper wires. In one embodiment, bondwires 115 form interconnections between IC 110 and signal pads on the perimeter of IC package 100. IC 110 is divided into different regions, i.e., regions 102, 104, 106 and 108. Each of these regions is divided based on the voltage drop measured from the signal pads on IC package 100 to the particular region. As an illustrative example, region 102 at the center of IC 110 has the highest voltage drop while region 108 closest to the signal pads on IC package 100 has the lowest voltage drop. In one embodiment, the voltage or IR drop in region 102 is greater than 46 mV while the IR drop in region 108 is less than 40 mV. Therefore, circuit blocks or circuit elements with critical timing may be placed in regions 106 and 108 and circuit blocks with less critical timing may be placed in regions 102 and 104. In the illustrative embodiment of FIG. 1, regions 102, 104, 106 and 108 are concentric and non-overlapping. That is, region 102 is a circle, while regions 104, 106, and 108 are annular rings centered around region 102. The borders between each of the regions represent a specific voltage drop, thus the borders for a region represent the voltage drop range for that region. Even though only four regions are shown in FIG. 1, one skilled in the art should appreciate that IC 110 may be divided into more or fewer regions. It should also be appreciated that the shape and size of each of the regions is dependent on IR drop values measured across the IC and not limited to the exemplary illustration of FIG. 1.

Figure 2:
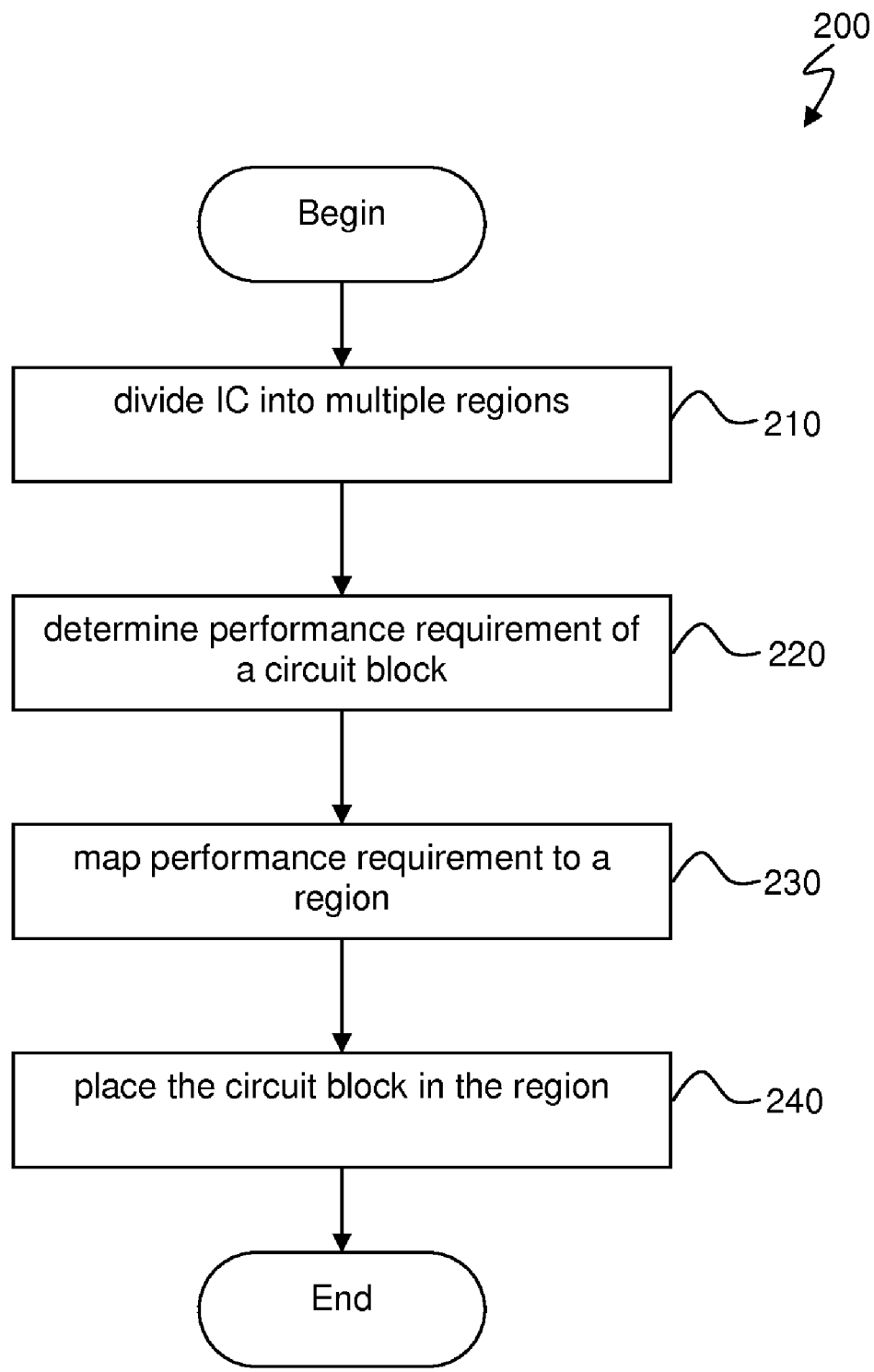
FIG. 2, meant to be illustrative and not limiting, is a simplified flow chart that shows a method flow for placing circuit blocks on an IC as an embodiment in accordance with the present invention.

FIG. 2, meant to be illustrative and not limiting, is a simplified flow chart that shows method flow 200 for placing circuit blocks on an IC as an embodiment in accordance with the present invention. The IC is divided into multiple regions in operation 210. In one embodiment, the IC is divided into different regions based on the voltage drop measured across the IC, similar to the illustrative example of FIG. 1. The performance requirement or timing requirement of a circuit block to be placed on the IC is determined in operation 220. In one embodiment, the performance requirement of a circuit block can be determined by running a timing analysis on the circuit block with a design software or computer-aided design (CAD) tool. The performance requirement of the circuit block is mapped to one of the region on the IC in operation 230. The circuit block is then placed in the mapped region in operation 240. In an exemplary embodiment, a circuit block with a high performance or timing requirement is placed in a low voltage drop region on the IC.

Figure 3:
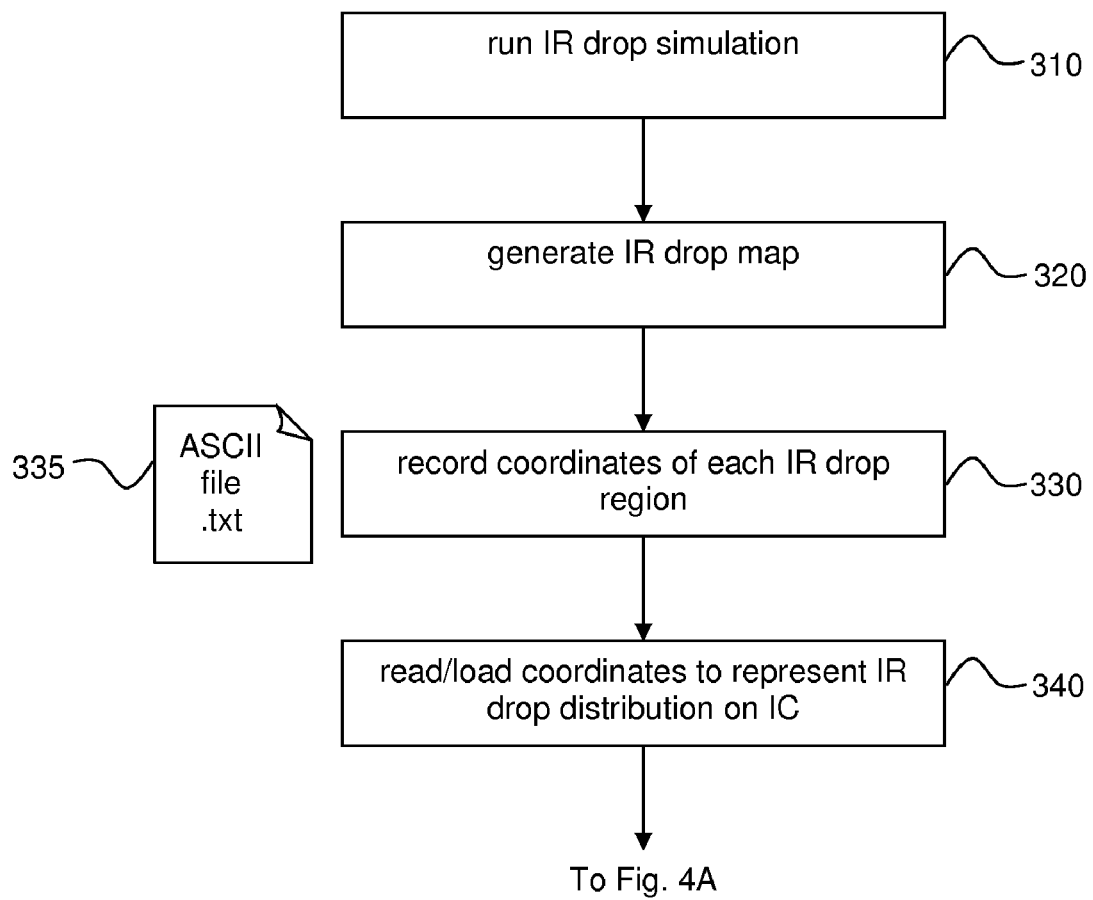
FIG. 3, meant to be illustrative and not limiting, shows a more detailed method flow for dividing an IC into different regions based on measured IR drop values as an embodiment in accordance with the present invention.

FIG. 3, meant to be illustrative and not limiting, shows a more detailed method flow for dividing an IC into different regions based on measured IR drop values as an embodiment in accordance with the present invention. An IR drop simulation is carried out on the IC in operation 310. The IR drop simulation can be performed using an electronic design automation (EDA) tool to approximate the IR drop values across different parts of the IC. An IR drop map is generated in operation 320. The IR drop map is generally a graphic representation of the different IR drop values on different parts of the IC. As an illustrative embodiment, the IC is divided into regions based on the measured IR drop values as shown in FIG. 1. The coordinates of each of the regions is recorded in operation 330. The coordinates may be stored as ASCII characters in text file 335. The coordinates of the IR drop distribution on the IC is read in operation 340.

Figure 4A:
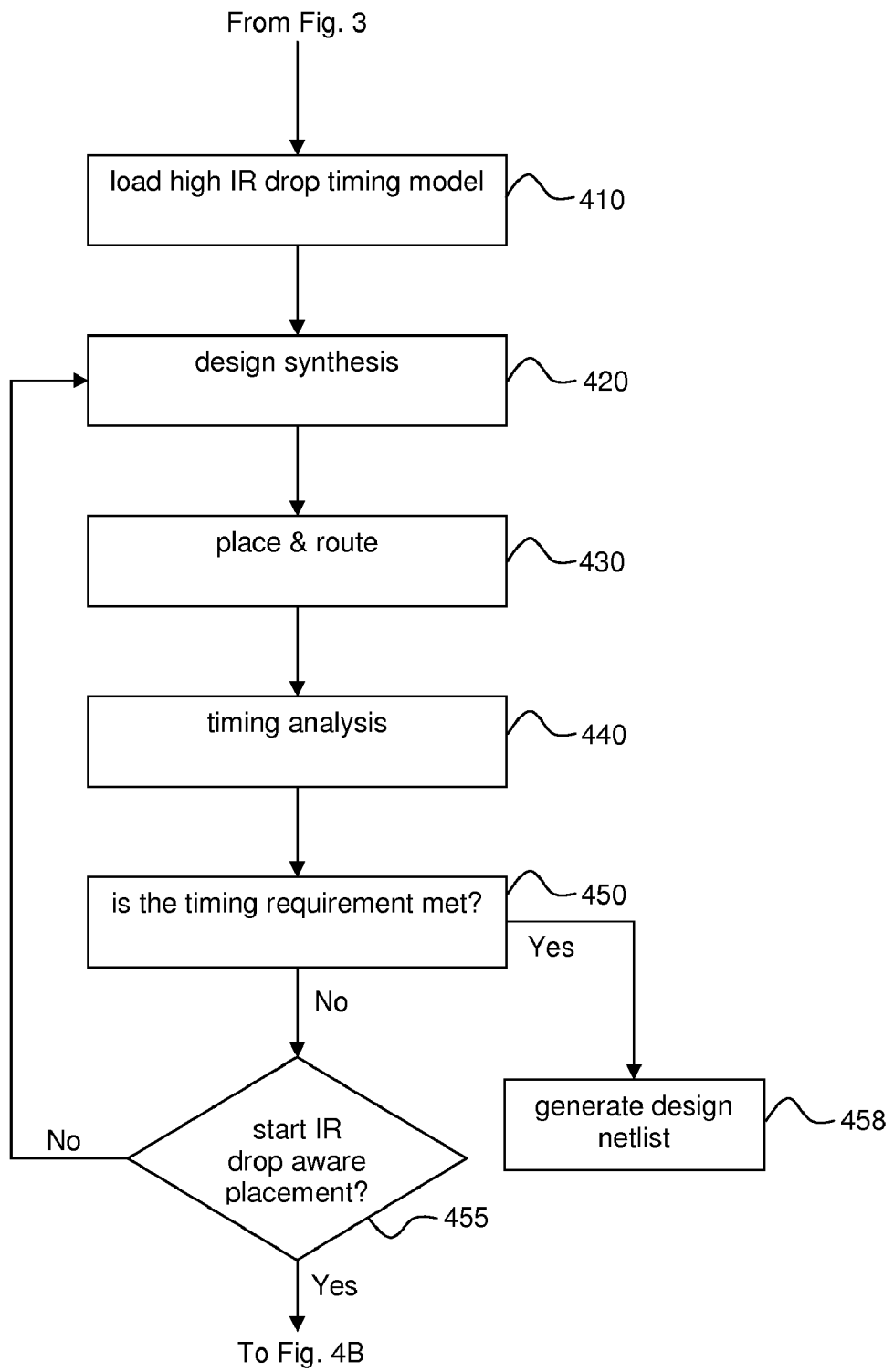
FIGS. 4A and 4B show the method flow for placing circuit blocks on an IC as another embodiment in accordance with the present invention.
Figure 4B:
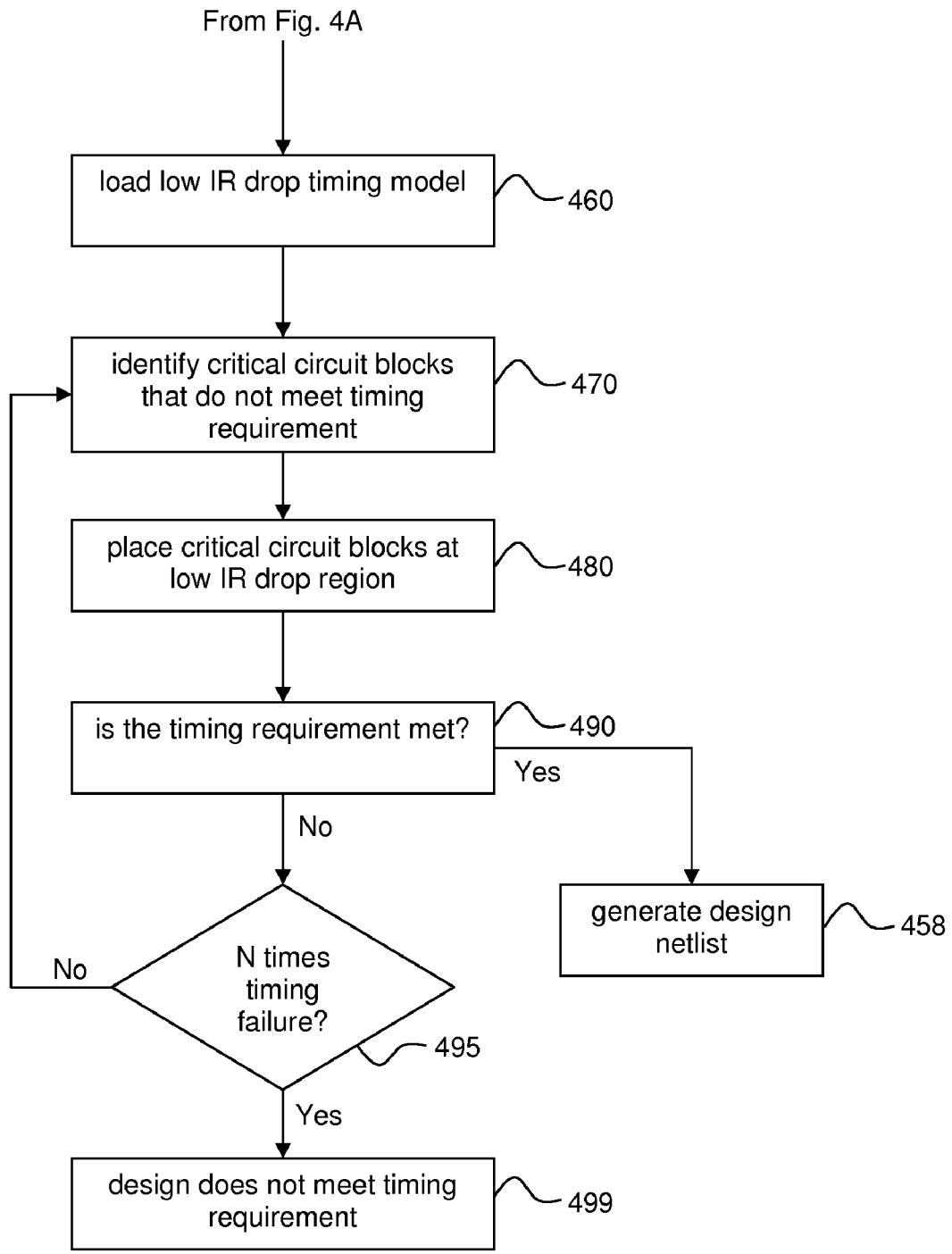

FIGS. 4A and 4B show the method flow for placing circuit blocks on an IC as another embodiment in accordance with the present invention. FIG. 4A shows a simplified flow diagram for determining a performance requirement of a circuit block and mapping the performance requirement of the circuit block based on a pre-determined IR drop timing model. A relatively high IR drop timing model is loaded in operation 410. It should be appreciated that the method flow shown in FIGS. 4A and 4B may be applicable to a field-programmable gate array (FPGA) design or a structured application-specific integrated circuit (structured ASIC) design. The IC design is synthesized in operation 420. It should be appreciated that an IC design is generally produced by a hardware engineer and embodied as a hardware description language (HDL) file that contains the required circuitry description. During synthesis in operation 420, the HDL file may be parsed to generate a design netlist that represents the resources (e.g., circuit blocks) needed in the IC design. The netlist is then placed and routed in operation 430. After place and route operation 430, timing analysis is performed in operation 440. The timing analysis in operation 440 calculates and assigns delays to circuit blocks in the design. If the timing requirement is met in operation 450, then a post-fit design netlist is generated in operation 458. If the timing requirement is not met in operation 450, and the IR drop aware placement is not selected in operation 455, then the IC design would be re-synthesized in operation 420. However, if the IR drop aware placement option is activated in operation 455, then the circuit blocks that fail to meet timing requirement during timing analysis in operation 440 can be relocated to a low IR drop region on the IC.

Continuing from FIG. 4A, FIG. 4B shows a simplified method flow for placing circuit blocks on an IC based on timing requirement. A relatively low IR drop timing model is loaded in operation 460. One skilled in the art should appreciate that different regions on an IC may be associated with a different timing model. For example, in the illustrative embodiment of FIG. 1, regions 102 and 104 may be associated with a relatively high IR drop timing model while regions 106 and 108 may be associated with a relatively low IR drop timing model. Critical circuit blocks that fail to meet timing requirement during timing analysis in operation 440 of FIG. 4A are identified in operation 470 of FIG. 4B. These circuit blocks with critical timing are placed or relocated to a lower IR drop region on the IC in operation 480. For example, such circuit blocks may be placed in region 106 or region 108 in the illustrative embodiment of FIG. 1. Once the circuit blocks are relocated to a lower IR drop region, a timing requirement check is performed in operation 490 to determine if the timing requirement can be met in the lower IR drop region. If the timing requirement can be met by the relocation, in operation 480, a post-fit netlist is generated in operation 458. Otherwise, the circuit blocks that do not meet timing requirement are relocated to yet a lower IR drop region. The process can be repeated for a pre-set number of times. In operation 495, N is a positive integer that represents the pre-set number of times for circuit blocks that fail timing requirement to be relocated to a different region. The IC design is determined to fail timing requirement in operation 499 if the timing failure cannot be resolved within N number of times.

Figure 5:
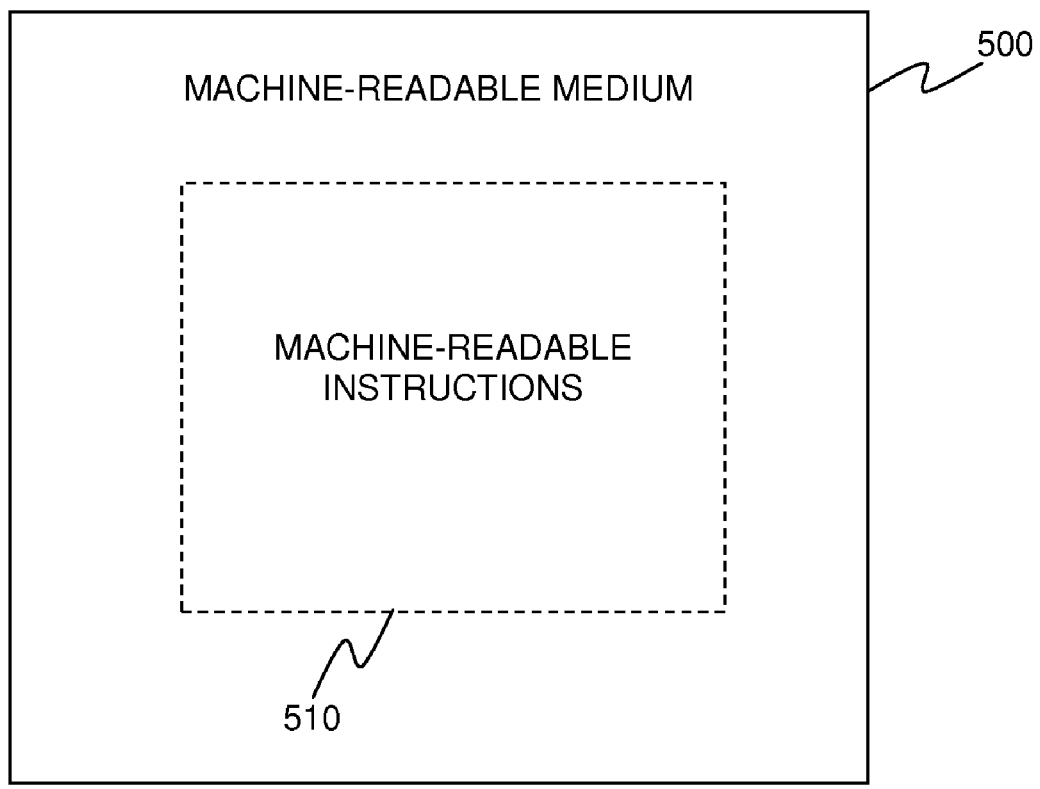
FIG. 5 is a simplified block diagram showing a machine-readable medium encoded with machine-readable instructions in as an embodiment in accordance with the present invention.

The invention can also be embodied as machine-readable instructions 510 on machine-readable medium 500 as shown in FIG. 5. Machine-readable medium 500 is any data storage device that can store data, which can thereafter be read by a machine or a computer system. Illustrative examples of machine-readable medium 500 include hard drives, network attached storage (NAS), read-only memory, random-access memory, CDs, DVDs, USB drives, volatile and non-volatile memory, and other optical and non-optical data storage devices. Machine-readable medium 500 can also be distributed over a network-coupled computer system so that machine-readable instructions 510 are stored and executed in a distributed fashion. Machine-readable instructions 510 can perform the steps illustrated in FIGS. 2, 3, 4A and 4B.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for placing a circuit block on an integrated circuit (IC), comprising:
   dividing the IC into a plurality of regions based on a voltage drop value measured from a plurality of signal pads on an IC package to the plurality of regions on the IC, wherein the measured voltage drop value approaches a minimum value at a periphery of the IC and approaches a maximum value at a center of the IC;
   determining a performance requirement for the circuit block; and
   placing, the circuit block in one of the plurality of regions on the IC, wherein placement of the circuit block is based on the performance requirement and the measured voltage drop value.

2. The method of claim 1, wherein the performance requirement is a timing requirement.

3. The method of claim 2, wherein a circuit block with a higher performance requirement is placed in a region with a lower voltage drop.

4. The method of claim 1, wherein the placing the circuit block occurs during a place and route operation executed by an electronic design automation (EDA) tool.

5. The method of claim 1, further comprising:
   receiving a plurality of input values representing coordinates, wherein the coordinates represent locations of the plurality of regions on the IC.

6. The method of claim 1, wherein the performance requirement is defined by an IC design.

7. The method of claim 6, wherein the IC design is for one of an application-specific integrated circuit (ASIC) or a field-programmable gate array (FPGA).

8. The method of claim 1, wherein the circuit block is a block of logic elements.

9. The method of claim 1, further comprising:
   repeating the determining and the placing for each of one or more additional circuit blocks.

10. The method of claim 1, wherein each of the plurality of regions is substantially circular in shape and concentric, without overlapping.

11. The method of claim 1, wherein borders for each of the plurality of regions is defined by the measured voltage drop value.

12. A non-transitory machine-readable storage medium encoded with machine-readable instructions for placing a circuit element on an integrated circuit (IC), comprising:
   program instructions for dividing the IC into a plurality of regions, wherein each of the plurality of regions corresponds to a range of voltage drop values measured from a plurality of signal pads on an IC package to the plurality of regions on the IC, wherein the voltage drop values across the IC range from a minimum voltage drop value at a periphery of the IC to a maximum voltage drop value at a center of the IC;
   program instructions for determining a timing constraint for the circuit element;
   program instructions for mapping the timing constraint to one of the plurality of regions on the IC based on the timing constraint and a respective range of voltage values; and
   program instructions for placing the circuit element onto the one of the plurality of regions.

13. The non-transitory machine-readable storage medium of claim 12, further comprising:
   an automated script to execute at least some of the program instructions in the machine-readable medium without user intervention.

14. The non-transitory machine-readable storage medium of claim 12, further comprising:
   program instructions to extract coordinates of the circuit element on the IC and wherein the circuit element is a logic element.

15. The non-transitory machine-readable storage medium of claim 14, wherein the coordinates are extracted from a text file and wherein the IC is an ASIC.

16. The non-transitory machine-readable storage medium of claim 15, wherein the text file is generated by a computer program.

17. The non-transitory machine-readable storage medium of claim 12, further comprising:
   program instructions to repeat the determining, the mapping and the placing for each of a plurality of additional circuit elements.

18. The method of claim 1, wherein the IC package comprises a wirebond IC package.

19. The non-transitory machine-readable medium of claim 12, wherein the IC package comprises a wirebond IC package.

* * * * *